United States Patent [19]

Shi

[11] Patent Number: 5,665,857
[45] Date of Patent: Sep. 9, 1997

[54] CONJUGATED POLYMER WITH BUILT-IN FLUORESCENT CENTERS AND METHOD OF MANUFACTURE

[75] Inventor: Song Q. Shi, Phoenix, Ariz.

[73] Assignee: Motorola, Schaumburg, Ill.

[21] Appl. No.: 304,450

[22] Filed: Sep. 12, 1994

[51] Int. Cl.⁶ .............. C08G 61/02; C08L 65/00; C08L 65/04; C08J 3/28
[52] U.S. Cl. .............. 528/373; 522/162; 525/535
[58] Field of Search .............. 522/162; 525/535; 528/373

[56] References Cited

U.S. PATENT DOCUMENTS

| | | | |
|---|---|---|---|
| 3,462,388 | 8/1969 | Horiguchi et al. | 8/647 |
| 5,473,047 | 12/1995 | Shi | 528/310 |
| 5,486,406 | 1/1996 | Shi | 428/209 |
| 5,504,183 | 4/1996 | Shi et al. | 528/272 |
| 5,552,547 | 9/1996 | Shi | 546/7 |
| 5,589,320 | 12/1996 | Ohnishi et al. | 430/321 |

*Primary Examiner*—Rabon Sergent
*Attorney, Agent, or Firm*—Eugene A. Parsons

[57] ABSTRACT

A conjugate polymer with fluorescent dye molecules built in as fluorescent centers is used in light emitting devices with improved fluorescent efficiency. In a first example, fluorescent dyes are introduced into a conjugated polymer precursor by a nucleophilic substitution reaction. In a second example, the fluorescent dye molecules are introduced into a conjugated polymer precursor by an ion-exchange reaction. In both examples, the conjugated polymer precursors with dye molecules attached are converted to the conjugated polymer with built-in fluorescent centers.

15 Claims, 1 Drawing Sheet

CONJUGATED POLYMER WITH BUILT-IN FLUORESCENT CENTERS AND METHOD OF MANUFACTURE

FIELD OF THE INVENTION

The present invention pertains to conjugated polymers for use in devices such as light emitting diodes.

BACKGROUND OF THE INVENTION

Unlike inorganic semiconductor light emitting devices, polymer light emitting devices are generally simple and relatively easy and inexpensive to fabricate. Also, a variety of colors and large-area devices are easily attained. However, one major problem in prior art polymers used in light emitting devices is that most of them have relative low quantum efficiency. For example, poly(phenylene vinylene) (PPV), one of the most studied polymers for LED application, has electroluminescence (EL) quantum efficiency approximately 0.06% with magnesium as metal electrode. Therefore the challenge is to improve the fluorescent efficiencies of polymers so that polymer light emitting devices can be practically useful.

Previous work on organic light emitting devices has shown that the EL quantum efficiency of a dye-doped small molecular organic thin film is about 3–4 times higher than that of an undoped film. In the prior art of polymer light emitting devices, some improvement in quantum efficiency is also achieved by dispersing fluorescent dye molecules into polymer matrix, but the resulting devices are normally not stable due to either aggregation or crystallization of the doped dyes from the polymer matrix. In the case of PPV, there has been no successful prior art in dye-doping because of its close packed rigid crystalline backbone.

It is a purpose of the present invention to provide a conjugated polymer for use in light emitting devices with improved efficiency.

It is another purpose of the present invention to provide a polymer for use in light emitting devices which has stable and uniformly distributed dye molecules which are chemically bonded to the polymer and uniformly fluorescent.

It is a further purpose of the present invention to provide a polymer for use in light emitting devices which is relatively easy and inexpensive to manufacture.

It is still another purpose of the present invention to provide specific methods to incorporate dye molecules as fluorescent centers into a conjugated polymer.

SUMMARY OF THE INVENTION

This invention aims at improving the fluorescent efficiency of a conjugated polymer used in the fabrication of light emitting devices. The above purposes and others are realized in a process for the preparation of a conjugated polymer which comprises building or incorporating dye molecules directly into a conjugated polymer which serves as a fluorescent center. A specific example for building fluorescent centers into a conjugated polymer, e.g. PPV, is disclosed. Dye molecules as fluorescent centers are incorporated into PPV by either a substitution or ion-exchange reaction at the precursor polymer stage of PPV. Then the PPV precursor is converted to the dye-containing PPV by a thermal or radiation treatment.

BRIEF DESCRIPTION OF THE DRAWINGS

Referring to the drawings.

DESCRIPTION OF THE PREFERRED EMBODIMENT

Figure 1:
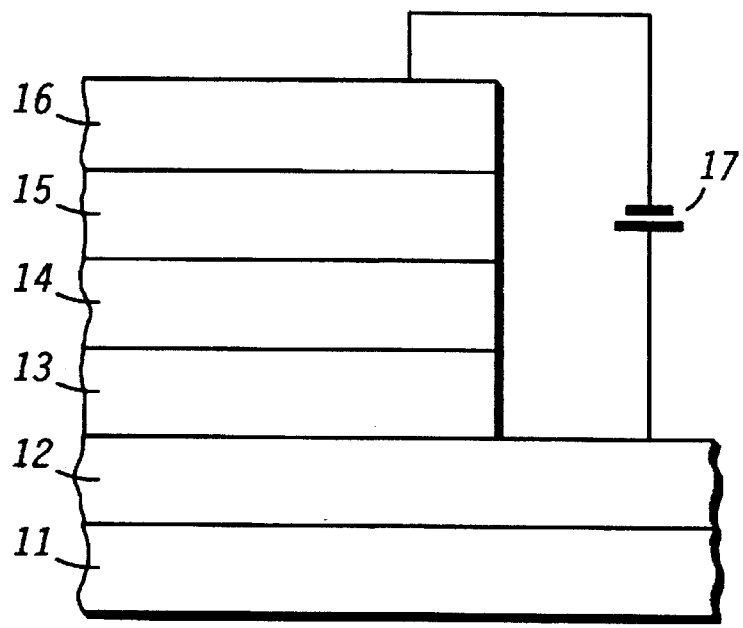
FIG. 1 is a simplified sectional view of a light emitting device structure incorporating the present invention.

Referring specifically to FIG. 1, a light emitting device (LED) 10 is illustrated in a simplified cross-sectional view. Generally, LED 10 includes a substrate 11 which in this specific embodiment is a glass plate having a relatively planar upper surface. An electrically conductive layer 12 is deposited on the planar surface of substrate 11 so as to form a relatively uniform electrical contact. Hole transporting and electron blocking material 13 is deposited on conductive layer 12 and a polymer layer 14 of fluorescent conjugated polymer is deposited onto material 13. Then electron transporting and hole blocking material 15 is deposited on polymer layer 14 and a second electrically conductive layer 16 is deposited on the upper surface of material 15 to form a second electrical contact.

It should be understood that light generated within polymer layer 14 can be emitted either through material 13, conductive layer 12 and substrate 11 or through material 15 and conductive layer 16. In the specific embodiment illustrated, conductive layer 12 is formed of organic or inorganic conductors, such as conductive polyaniline (PANI), indium-tin-oxide (ITO), which are substantially transparent to visible light so that the emitted light exits downwardly through substrate 11 in FIG. 1.

Also, in FIG. 1 LED 10 has a potential applied between conductive layers 12 and 16 by means of a potential source 17. In this embodiment conductive layer 12 is a p-type contact and conductive layer 16 is an n-type contact. The negative terminal of potential source 17 is connected to conductive layer 16 and the positive terminal is connected to conductive layer 12. The electrons injected from the n-type contact are transported throughout material 15 and into fluorescent conjugated polymer layer 14 and the holes injected from the p-type contact are transported through material 13 and into fluorescent conjugated polymer layer 14, where upon an electron and a hole recombination a photon is emitted. Material 13, which is made of any known hole transporting materials, is used to transport holes into polymer layer 14 and confine electrons in polymer layer 14; while material 15, which is made of any known electron transporting materials, is used to transport electrons into polymer layer 14 and confine holes in polymer layer 14. Thus the holes and electrons have the maximum opportunity to recombine in polymer layer 14 to give off light and polymer layer 14 is an emissive layer.

Figure 2:
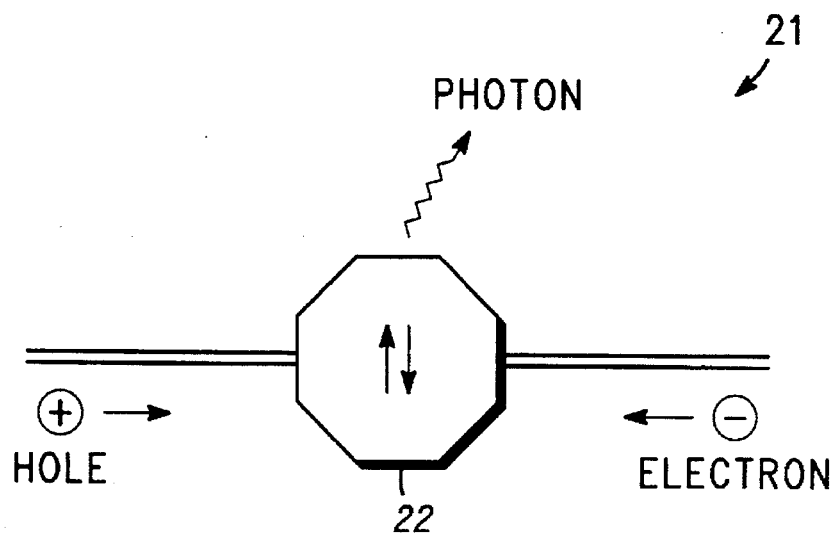
FIG. 2 is a schematic representation of a conjugated polymer with a built-in fluorescent center.

A method to improve the fluorescent efficiency of a conjugate polymer by building fluorescent centers directly into the conjugated polymer will now be described. Referring specifically to FIG. 2, a schematic representation of one single conjugated polymer 21 with one single built-in fluorescent center 22 is illustrated. Fluorescent center 22, made from, but not limited to, molecules of anyone of the known high efficiency fluorescent dyes inserted into conjugated polymer 21 is used in a typical LED structure (e.g. FIG. 1) as an emissive layer. Here it should be noted that conjugated polymer 21 can be selected to include any of the known organic, inorganic and organometallic conjugated polymers. Also, the high efficiency fluorescent dyes include at least one of organic, inorganic and organometallic fluorescent dye molecules. Conjugated polymer 21 transports the carriers (electrons and/or holes), injected from the n-type contact and p-type contact to fluorescent center 22, where electrons and holes recombine to give off light. The color tunability is achieved by manipulating the characteristics of the inserted dye molecules which are the fluorescent centers.

A specific example for preparation of a conjugated polymer with built-in fluorescent centers, for the purpose of improving the fluorescent efficiency in accordance with the present invention, is the use of PPV with fluorescent dye molecules incorporated into its backbone. PPV is normally prepared from a precursor polymer, spin-coated or cast from a methanol solution, by a thermal or UV radiation treatment.

Two methods for incorporating fluorescent centers made of high efficiency fluorescent dye molecules into a conjugated polymer in accordance with the present invention are disclosed. One method involves a substitution reaction and another method involves an ion-exchange reaction. To illustrate these two methods, specific examples utilizing PPV and specific high efficiency fluorescent dye molecules are used, but it must be understood that these are only disclosed for purposes of examples and a wide variety of conjugated polymers and high efficiency fluorescent dye molecules can be used in the performance of either of the disclosed methods.

The method to introduce fluorescent centers into PPV by a substitution reaction at its precursor stage is illustrated below.

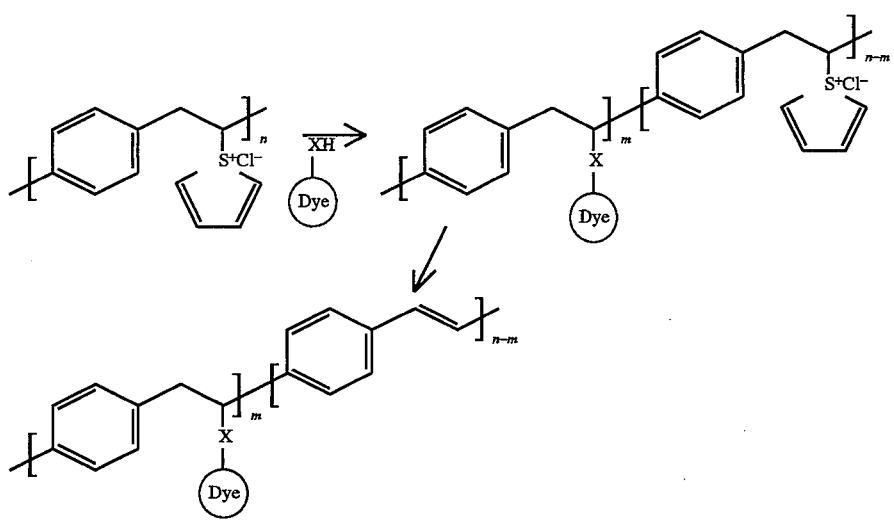

In this method, a fluorescent dye, bearing one nucleophilic group, with the desired color and efficiency is allowed to react with the PPV precursor in methanol solution by replacing the sulfonium group. X is one of the following nucleophiles: $NH^-$, $NHNH^-$, $S^-$, $O^-$, etc.; m is the average number of repeating units bearing a dye molecule in the PPV precursor; and n is the average number of repeating units bearing the sulfonium chloride salt in the PPV precursor. In this method, m/(n–m) represents the fluorescent center (e.g. dye molecule) content in PPV, which is preferably in the range of approximately 0.1%–5%. Two examples of the nucleophiles which may be used as the dye molecules in the present method are illustrated below as FC-1 and FC-2.

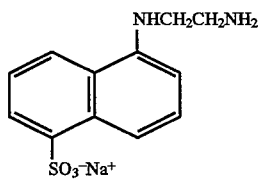

FC-1

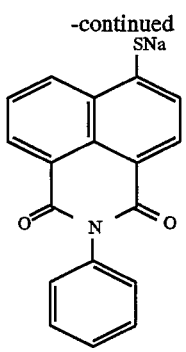

FC-2

Since the dye molecule content is very low, the polymer precursor with dye molecule attached still has a solubility similar to the pristine precursor. In this specific example, the precursor polymer with dye attached is then converted to PPV by slow thermal treatment at 50°–100° C. under vacuum or forming gas first, which causes the partially converted PPV to undergo a slight crosslinking. Then the thermal treatment temperature is raised to about 200° C. to finish the total conversion. Alternatively the PPV precursor with dye molecule attached is converted to PPV by ultraviolet (UV) radiation treatment. Thus, a conjugated polymer with built-in fluorescent dye molecules as fluorescent centers is produced.

The method for introducing fluorescent centers into PPV by an ion-exchange reaction at its precursor stage is illustrated below.

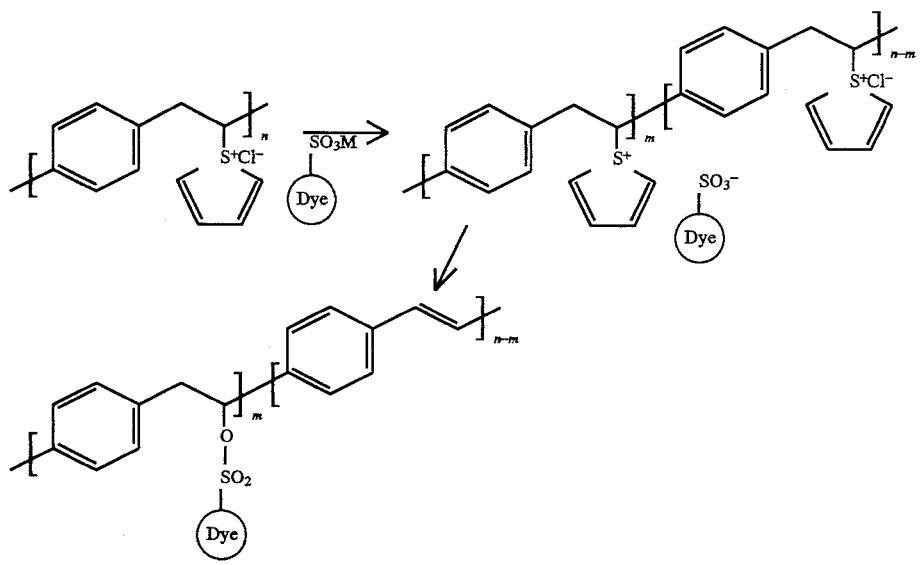

In this method fluorescent centers are introduced into PPV by an ion exchange reaction at its precursor polymer stage. In the ion exchange reaction, an anionic dye molecule with the desired color and other characteristics replaces a chloride anion. In the above illustrated reaction: M is a cation, such as $Na^+$, $K^+$, $NH_4^+$ etc.; m is the average number of repeating units bearing a sulfonium anionic dye salt in the PPV precursor; and n is the average number of repeating units bearing the sulfonium chloride salt in the PPV precursor. In this example, m/(n−m) represents the fluorescent center (e.g. dye molecule) content in PPV, preferred to be around 0.1%−5%. Two examples of the anionic dye molecules used in the present invention are illustrated below and designated FC-3 and FC-4.

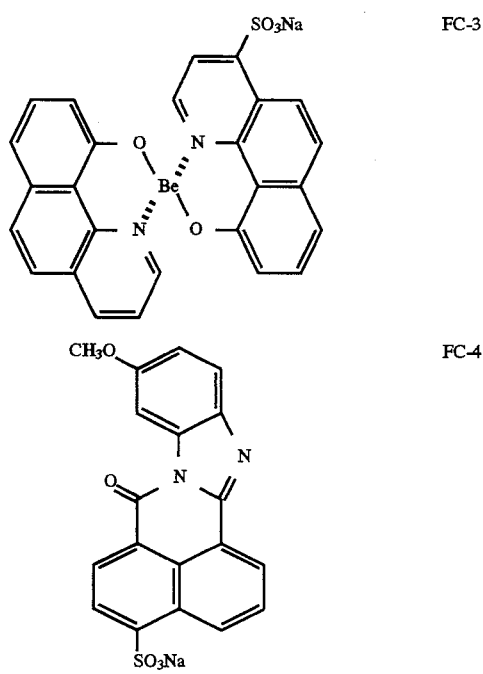

Since the dye molecule content is relatively low, the PPV precursor with dye attached still has approximately the same solubility as the pristine precursor. The precursor with dye attached is then converted to PPV by slow thermal treatment at 50°–100° C. under vacuum or forming gas first, which causes the partially converted PPV to undergo a slight crosslinking. Then the thermal treatment temperature is raised to about 200° C. to finish the total conversion. The trapped sulfonic acid dye molecules generated during the conversion, react with the nearby double bond in PPV in a fashion similar to the strong acid doping of PPV, which incorporates the dye molecules into the PPV.

Alternatively the dye-containing PPV precursor is converted to PPV by UV radiation treatment. Thus, a conjugated polymer with built-in fluorescent dye molecules as fluorescent centers is produced. Since the dye molecule content ranges only from 0.1% to 5% in the precursor, the resulting PPV still has 95%–99.9% of the basic conjugated structure of PPV, which insures its ability to transport carriers almost intact.

The quantum efficiencies of the LEDs fabricated from the PPV with built-in fluorescent centers, as illustrated in the above examples, can be 2–4 times higher then that of the pristine PPV, depending on the dye content.

Compared to physically dispersed dye molecules in polymers, the chemically bonded dye molecules are randomly distributed in the conjugated polymer, thus they offer more uniform fluorescence when activated. Also, Unlike the dye molecules physically dispersed in a polymer, the dye molecules chemically bonded to a polymer can not phase separate from or crystallize out of the polymer matrix. Therefore the conjugated polymers with chemically bonded dye molecules as fluorescent centers are more stable.

It should be understood that though one specific example of conjugated polymer with built-in fluorescent centers and two specific methods on how to incorporate the fluorescent centers into a conjugated polymer have been described and shown in the embodiments of the present invention, this invention is not limited to the particular examples and methods.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A conjugated polymer with built-in fluorescent dye molecules as fluorescent centers, wherein the conjugated polymer includes poly(phenylene vinylene).

2. A conjugated polymer with built-in fluorescent dye molecules as claimed in claim 1 wherein the fluorescent dye molecules are chemically bonded to the conjugated polymer.

3. A conjugated polymer with built-in fluorescent dye molecules as claimed in claim 1 wherein the fluorescent dye molecules are selected from one of organic or organometallic fluorescent dye molecules.

4. A method for the preparation of poly(phenylene vinylene) with built-in fluorescent dye molecules as fluorescent centers including the step of introducing the fluorescent dye molecules into the poly(phenylene vinylene) at a precursor stage of the poly(phenylene vinylene).

5. A method for the preparation of poly(phenylene vinylene) with built-in fluorescent centers as claimed in claim 4 wherein the introducing step includes chemically bonding poly(phenylene vinylene) precursor with a fluorescent dye molecule by a substitution reaction.

6. A method for the preparation of poly(phenylene vinylene) with built-in fluorescent centers as claimed in claim 5, wherein the chemically bonding by a substitution reaction step is performed in accordance with the following:

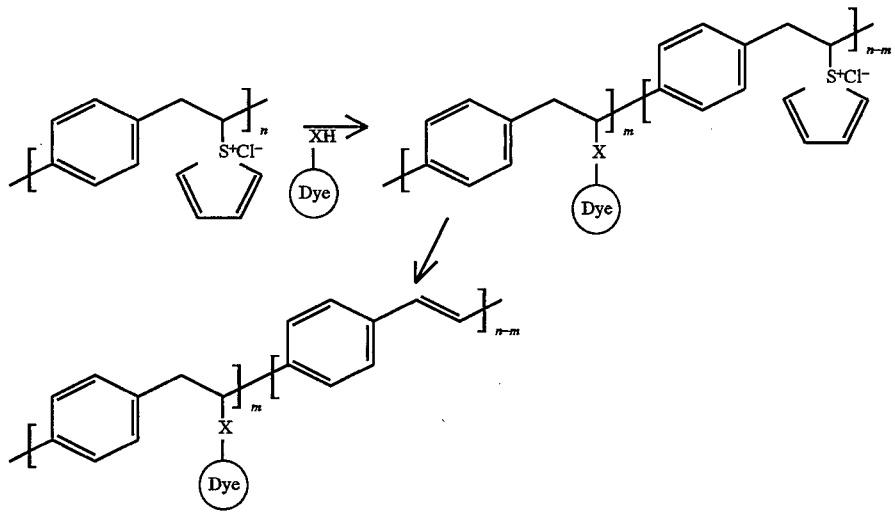

where:
n is the average number of repeating units bearing the sulfonium chloride salt;
m is the average number of repeating units bearing a dye molecule;
X is a nucleophilic group; and
Dye is an organic or organometallic fluorescent dye molecule.

7. A method for the preparation of poly(phenylene vinylene) with built-in fluorescent centers as claimed in claim 5 including the step of providing a fluorescent dye molecule with a nucleophilic group and a poly(phenylene vinylene) precursor with a sulfonium group and wherein the chemically bonding step includes substituting the nucleophilic group for the sulfonium group.

8. A method for the preparation of poly(phenylene vinylene) with built-in fluorescent centers as claimed in claim 7 wherein the nucleophilic group is selected from $NH_2$, $NHNH_2$, SH, or OH.

9. A method for the preparation of poly(phenylene vinylene) with built-in fluorescent centers as claimed in claim 5 wherein the chemically bonding step includes providing a fluorescent dye selected from one of:

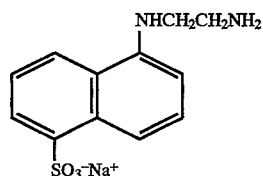

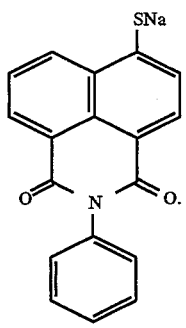

10. A method for the preparation of poly(phenylene vinylene) with built-in fluorescent centers as claimed in claim 4 wherein the introducing step includes chemically bonding poly(phenylene vinylene) precursor with a fluorescent dye molecule by an ion-exchange reaction.

11. A method for the preparation of poly(phenylene vinylene) with built-in fluorescent centers as claimed in claim 10, wherein the step of chemically bonding by ion-exchange reaction is performed in accordance with the following:

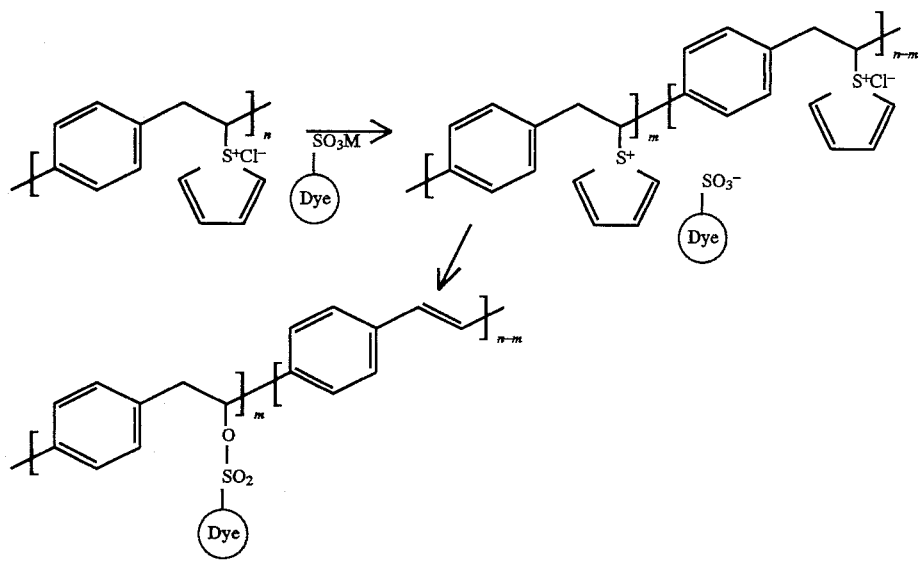

where:

n is the average number of repeating units bearing the sulfonium chloride salt;

m is the average number of repeating units bearing a dye molecule;

M is a cation; and

Dye is an organic or organometallic fluorescent dye molecule.

12. A method for the preparation of poly(phenylene vinylene) with built-in fluorescent centers as claimed in claim 10 including the step of providing poly(phenylene vinylene) precursor having chloride anions and a fluorescent dye having anionic dye molecules and the introducing step includes exchanging the chloride anions in the poly(phenylene vinylene) precursor with the anionic dye molecules of the fluorescent dye.

13. A method for the preparation of poly(phenylene vinylene) with built-in fluorescent centers as claimed in claim 12 wherein the step of providing a fluorescent dye having anionic dye molecules includes providing one of:

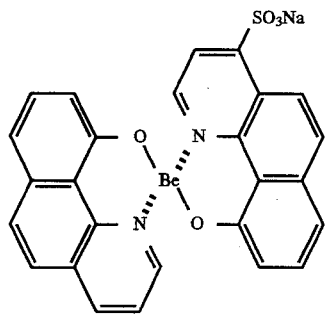

-continued

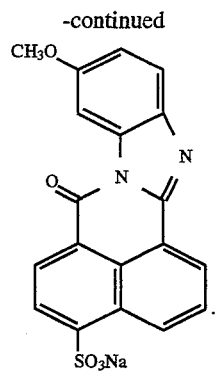

14. A method for the preparation of poly(phenylene vinylene) with built-in fluorescent centers as claimed in claim 4 including in addition the step of converting the poly(phenylene vinylene) at a precursor stage with fluorescent dye molecules introduced therein to poly(phenylene vinylene) with built-in fluorescent dyes utilizing a thermal treatment.

15. A method for the preparation of poly(phenylene vinylene) with built-in fluorescent centers as claimed in claim 4 including in addition the step of converting the poly(phenylene vinylene) at a precursor stage with fluorescent dye molecules introduced therein to poly(phenylene vinylene) with built-in fluorescent dyes utilizing a radiation treatment.

* * * * *